United States Patent
Mizumura

(10) Patent No.: US 9,844,835 B2
(45) Date of Patent: Dec. 19, 2017

(54) PRODUCTION METHOD FOR DEPOSITION MASK AND DEPOSITION MASK

(71) Applicant: V TECHNOLOGY CO., LTD., Kanagawa (JP)

(72) Inventor: Michinobu Mizumura, Yokohama (JP)

(73) Assignee: V TECHNOLOGY CO., LTD. (JP)

( * ) Notice: Subject to any disclaimer, the term of this patent is extended or adjusted under 35 U.S.C. 154(b) by 0 days.

(21) Appl. No.: 14/713,519

(22) Filed: May 15, 2015

(65) Prior Publication Data

US 2015/0246416 A1 Sep. 3, 2015

Related U.S. Application Data

(63) Continuation of application No. PCT/JP2013/079304, filed on Oct. 29, 2013.

(30) Foreign Application Priority Data

Nov. 15, 2012 (JP) ................. 2012-250972

(51) Int. Cl.

| B23K 26/38 | (2014.01) |
|---|---|
| B23K 26/40 | (2014.01) |
| C23C 14/04 | (2006.01) |
| B23K 26/03 | (2006.01) |
| B23K 26/382 | (2014.01) |
| B23K 26/402 | (2014.01) |

(Continued)

(52) U.S. Cl.
CPC .............. *B23K 26/40* (2013.01); *B23K 26/03* (2013.01); *B23K 26/382* (2015.10); *B23K 26/402* (2013.01); *C23C 14/042* (2013.01); *B23K 2203/172* (2015.10); *B23K 2203/42* (2015.10); *B23K 2203/50* (2015.10)

(58) Field of Classification Search
CPC .... C23C 14/042; B23K 26/381; B23K 26/30; B23K 2203/42; B23K 26/40; B23K 26/402; B23K 2203/172; B23K 26/382
See application file for complete search history.

(56) References Cited

U.S. PATENT DOCUMENTS

2010/0080915 A1* 4/2010 Masuda ................ C23C 14/042
427/282

FOREIGN PATENT DOCUMENTS

| CN | 1534383 A | 10/2004 |
|---|---|---|
| JP | 2004190057 A | 7/2004 |

(Continued)

OTHER PUBLICATIONS

Machine translation of JP2012220923A.*

(Continued)

*Primary Examiner* — Vishal I Patel
(74) *Attorney, Agent, or Firm* — Lerner, David, Littenberg, Krumholz & Mentlik, LLP

(57) ABSTRACT

To provide a production method including: a first step of forming a mask member in which a resin film and a magnetic metal member, which has first through-holes and second through-holes, are brought into close contact; a second step in which a peripheral edge of the magnetic metal member is bonded to one end face of a frame; and a third step in which a portion of the film in each first through-hole is irradiated with laser light to form an opening pattern, and a portion of the film in each second through-hole is irradiated with laser light to form a mask-side alignment mark.

5 Claims, 6 Drawing Sheets

(51) Int. Cl.
B23K 103/16 (2006.01)
B23K 103/00 (2006.01)

(56) References Cited

FOREIGN PATENT DOCUMENTS

| JP | 2006111941 A | 4/2006 |
| JP | 2006241547 A | 9/2006 |
| JP | 2008024956 A | 2/2008 |
| JP | 2008121060 A | 5/2008 |
| JP | 2010106358 A | 5/2010 |
| JP | 2012077328 A | 4/2012 |
| JP | 2012-220923 | 11/2012 |
| JP | 2012220923 A | 11/2012 |
| JP | 2012250972 A | 12/2012 |
| TW | 201243523 A | 11/2012 |
| WO | 2013039196 A1 | 3/2013 |
| WO | 2013105643 A1 | 7/2013 |

OTHER PUBLICATIONS

International Preliminary Report on Patentability for Application No. PCT/JP2013/079304 dated May 19, 2015.
International Search Report for Application No. PCT/JP2013/079304 dated Dec. 3, 2013.
Chinese Office Action for Application. No. 201380059305.3 dated Jul. 26, 2016.
Japanese Office Action for Application No. 2012250972 dated Oct. 25, 2016.
Taiwanese Office Action for Application No. 102141381 dated Dec. 7, 2016.
Chinese Office Action for Application. No. 201380059305.3 dated Jan. 19, 2017.

* cited by examiner

PRODUCTION METHOD FOR DEPOSITION MASK AND DEPOSITION MASK

CROSS-REFERENCE TO RELATED APPLICATIONS

This application is a continuation application of PCT/JP2013/079304, filed on Oct. 29, 2013, and claims priority to Japanese Patent Application No. 2012-250972, filed on Nov. 15, 2012, the disclosures of which are hereby incorporated herein by reference.

FIELD OF THE INVENTION

The present invention relates to a production method for a deposition mask that includes opening patterns corresponding to a plurality of thin-film patterns formed on a substrate, and more particularly, relates to a production method for a deposition mask and to a deposition mask that can form opening patterns and alignment marks with high positional accuracy.

BACKGROUND

In a conventional production method for a deposition mask, an end of a mask sheet, which has a plurality of opening patterns and is made of nickel or nickel alloy, is fixed to a frame by spot welding (see JP 2006-241547 A, for example).

However, such a conventional production method for a deposition mask has a problem in that, when the mask sheet is stretched and fixed to the end of the frame, the mask sheet is extended, causing misalignment of opening patterns and alignment marks, since the opening patterns and the alignment marks are formed on the mask sheet before the mask sheet is fixed to the frame. Accordingly, the deposition mask cannot be accurately aligned to a film formation substrate, with the result that thin-film patterns cannot be accurately formed.

SUMMARY OF THE INVENTION

In view of this, the present invention aims to solve the above problem and provide a production method for a deposition mask and a deposition mask that can form opening patterns and alignment marks with high positional accuracy.

In order to attain the foregoing object, a production method for a deposition mask according to a first aspect is a production method for a deposition mask for forming a plurality of thin-film patterns on a substrate, the method including: a first step of forming a mask member in which a resin film and a magnetic metal member, which has a plurality of first and second through-holes formed at positions respectively corresponding to the plurality of thin-film patterns and a plurality of substrate-side alignment marks preliminarily formed on the substrate, are brought into close contact with each other, each of the first through-holes having a shape and dimension greater than those of the thin-film pattern, and each of the second through-holes having a shape and dimension greater than those of the substrate-side alignment mark; a second step in which the mask member is stretched on one end face of a frame having an opening enclosing the plurality of first and second through-holes of the magnetic metal member, and a peripheral edge of the magnetic metal member is bonded to the end face of the frame; and a third step in which a portion of the film at the position corresponding to the thin-film pattern in each of the first through-holes is irradiated with laser light to form an opening pattern having a shape and dimension that are the same as those of the thin-film pattern, and a portion of the film at the position corresponding to the substrate-side alignment mark in each of the second through-hole is irradiated with laser light to form a mask-side alignment mark.

Preferably, the third step includes the steps of: forming each of the opening patterns at a portion of the film corresponding to the first through-hole by moving an irradiated position of the laser light by a predetermined distance in a stepwise manner, and reading and storing coordinates of each opening pattern in an X-Y plane; reading the stored coordinates of the opening patterns to calculate an average value, and calculating coordinates at a center of an opening-pattern formation region in which the plurality of opening patterns is formed; and forming each of the mask-side alignment mark at the position in the corresponding second through-hole, the position being apart from the calculated coordinate at the center, serving as a reference, by a particular distance.

Alternatively, the third step may include the steps of: forming the mask-side alignment mark at the portion of the film in a second through-hole selected from the plurality of second through-holes; and forming each of the opening patterns at a portion of the film corresponding to first through-hole by moving the irradiated position of the laser light by a predetermined distance in a stepwise manner with the formed mask-side alignment mark being used as a reference, and forming the other mask-side alignment marks at the portions of the film in the other second through-holes.

More preferably, the first through-holes has a rectangular shape and are disposed on the magnetic metal member in a matrix at regular intervals, and each of the plurality of opening patterns is formed in the corresponding first through-hole.

Alternatively, the plurality of first through-holes may have a stripe shape and may be disposed on the magnetic metal member in parallel at regular intervals, and each of the plurality of opening patterns may have a stripe shape and may be formed in the corresponding first through-hole.

A deposition mask according to a second aspect is a deposition mask produced by the production method according to the first aspect.

According to the present aspect, after the mask member in which the resin film is brought into close contact with the magnetic metal member having the plurality of first and second through-holes is stretched on the frame, the opening patterns are formed in the first through-holes and the mask-side alignment marks are formed in the second through-holes. Accordingly, even if the positions of the first and second through-holes are shifted due to an extension of the mask member upon stretching the mask member onto the frame, the opening patterns and the mask-side alignment marks can be formed as designed. Consequently, positional accuracy in forming the opening patterns and the mask-side alignment marks can be improved.

BRIEF DESCRIPTION OF THE DRAWINGS

FIGS. 2A and 2B are views illustrating a deposition mask produced by the production method according to the present invention, wherein FIG. 2A is a plan view, and FIG. 2B is a sectional view;

DETAILED DESCRIPTION

Figure 1:
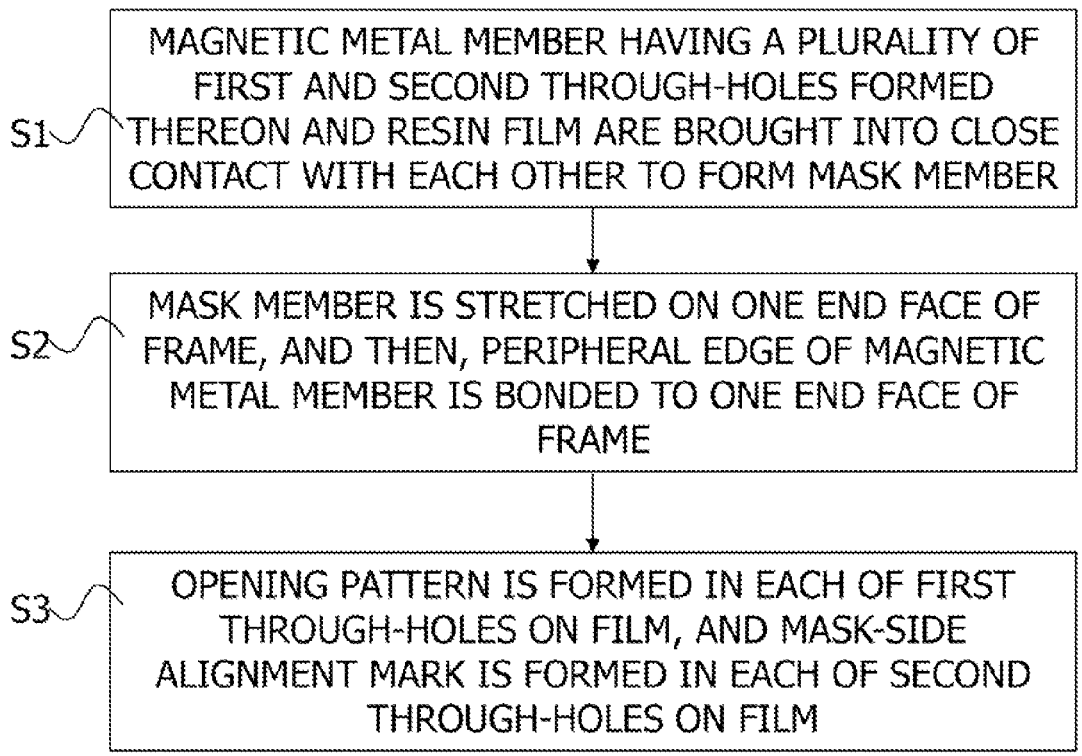
FIG. 1 is a flowchart illustrating an embodiment of a production method for a deposition mask according to the present invention.

Hereinbelow, an embodiment of the present invention will be described in detail with reference to the accompanying drawings. FIG. 1 is a flowchart illustrating an embodiment of a production method for a deposition mask according to the present invention. This production method for a deposition mask is for forming a plurality of thin-film patterns on a substrate, and includes a first step S1 of forming a mask member formed by allowing a magnetic metal member and a resin film to be in close contact with each other, a second step S2 of bonding the mask member to a frame, and a third step S3 of forming opening patterns and mask-side alignment marks on the film. Hereinbelow, each step will be described in detail.

Figure 2A:
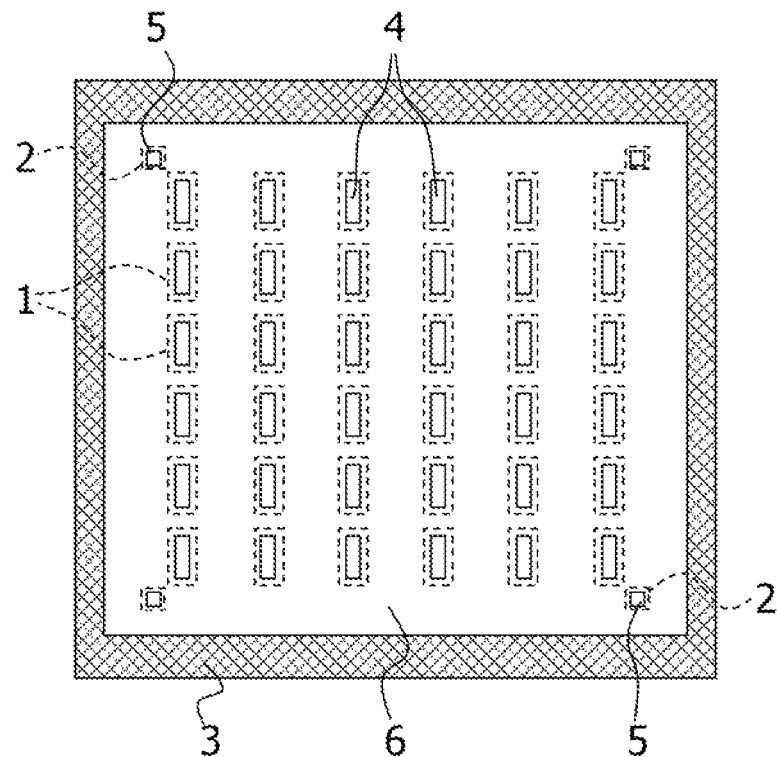
Figure 2B:
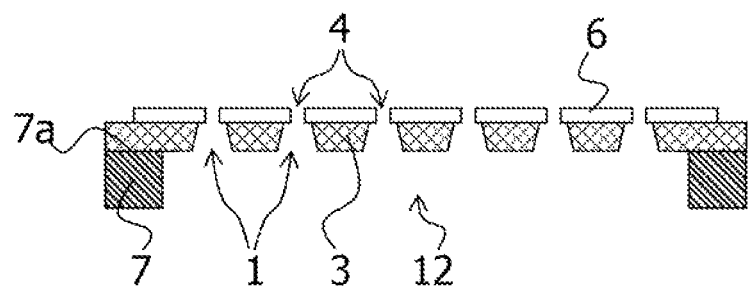

FIGS. 2A and 2B are views illustrating a deposition mask produced by the production method according to the present invention, wherein FIG. 2A is a plan view, and FIG. 2B is a sectional view.

This deposition mask has a structure in which a magnetic metal member 3 and a film 6 are brought into close contact with each other. The magnetic metal member 3 has rectangular first through-holes 1 arrayed in a matrix so as to correspond to the plurality of thin-film patterns, which is to be formed on a substrate, with an array pitch that is the same as that of the plurality of thin-film patterns, and second through-holes 2 formed to correspond to substrate-side alignment marks preliminarily formed on the substrate, wherein each of the first through-holes 1 has a shape and dimension greater than those of the thin-film pattern, and each of the second through-hole 2 has a shape and dimension greater than those of the substrate-side alignment mark. The film 6 has opening patterns 4 arrayed in a matrix to correspond to the plurality of thin-film patterns with an array pitch the same as that of the plurality of thin-film patterns, and mask-side alignment marks 5 that are formed to correspond to the substrate-side alignment marks preliminarily formed on the substrate, wherein each of the opening patterns 4 has a shape and dimension equal to those of the thin-film pattern, and the mask-side alignment marks 5 are formed for an alignment to the substrate-side alignment marks. The magnetic metal member 3 and the film 6 are brought into close contact with each other in such a manner that each of the opening patterns 4 is located in a corresponding first through-hole 1, and each of the mask-side alignment marks 5 is located in a corresponding second through-hole 2, and one end face 7a of a frame 7 is bonded to a peripheral edge of the magnetic metal member 3.

The above first step S1 is a process for forming a mask member 11 in which the resin film 6 and the magnetic metal member 3, which has a plurality of first and second through-holes 1 and 2 formed at positions respectively corresponding to the plurality of thin-film patterns and the plurality of substrate-side alignment marks preliminarily formed on the substrate, are brought into close contact with each other, each of the first through-holes 1 having a shape and dimension greater than those of the thin-film pattern and each of the second through-holes 2 having a shape and dimension greater than those of the substrate-side alignment mark.

Figure 3A:
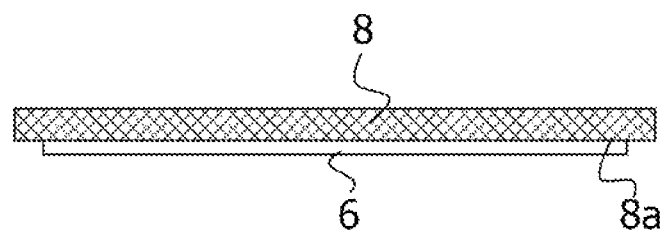
FIGS. 3A to 3C are views for describing a process of forming a mask member.

More specifically, as illustrated in FIG. 3A, resin liquid such as polyimide or polyethylene terephthalate (PET) is applied on one surface 8a of a magnetic metal sheet 8, which is made of a material such as nickel, nickel alloy, Invar, or Invar alloy, and has a thickness of 30 μm to 50 μm, and the resulting coating is dried, whereby a resin film 6 having a thickness of 10 μm to 30 μm and transmitting visible light is formed. In this case, the above resin liquid may be applied at the interior of the peripheral edge region of the magnetic metal sheet 8 by screen printing.

Figure 3B:
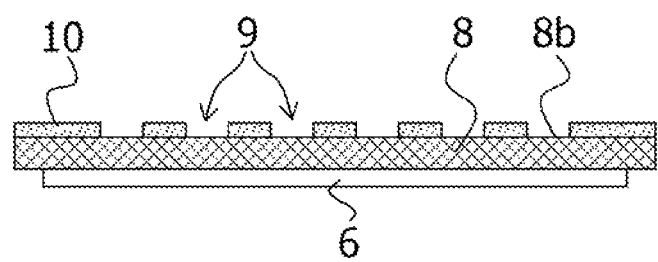

Next, as illustrated in FIG. 3B, resist is applied on the other surface 8b of the magnetic metal sheet 8 with a spray, for example, and then, the resultant is dried to form a resist film. After being exposed through a photomask, the resist film is developed to form a resist mask 10, which has a plurality of first openings 9, each having a shape and dimension greater than those of the thin-film pattern, at the position corresponding to the plurality of thin-film patterns, and second openings (not shown), each having a shape and dimension greater than those of the substrate-side alignment mark, at the position corresponding to the substrate-side alignment marks formed on the substrate.

Figure 3C:
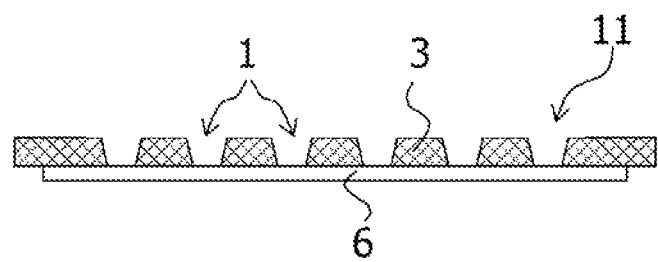

Then, as illustrated in FIG. 3C, the magnetic metal sheet 8 is wet-etched, using the resist mask 10, to remove portions of the magnetic metal sheet 8 corresponding to the first openings 9 of the resist mask 10, so as to form the first through-holes 1, and to remove the portions of the magnetic metal sheet 8 corresponding to the second openings, so as to form the second through-holes 2, whereby the magnetic metal member 3 is formed. With this process, the mask member 11 is formed in which the magnetic metal member 3 and the resin film 6 are brought into close contact with each other. Notably, etching liquid for etching the magnetic metal sheet 8 can be selected appropriately according to the material of the magnetic metal sheet 8 to be used, and any known techniques can be employed.

The above second step S2 is a process in which the mask member 11 is stretched on one end face 7a of the frame 7 that has an opening 12 enclosing the plurality of first and second through-holes 1 and 2 of the magnetic metal member 3 and made of a material such as Invar or Invar alloy, and the peripheral edge of the magnetic metal member 3 is bonded to the end face 7a of the frame 7.

Figure 4A:
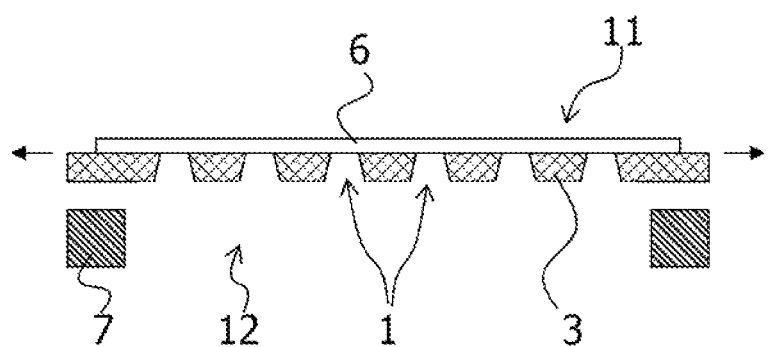
FIGS. 4A and 4B are views for describing a process of bonding the mask member to a frame.

More specifically, as illustrated in FIG. 4A, the mask member 11 is positioned above the frame 7 with tension to such an extent that the mask member 11 is not warped to the side (the direction of an arrow) parallel to the surface of the mask member 11.

Figure 4B:
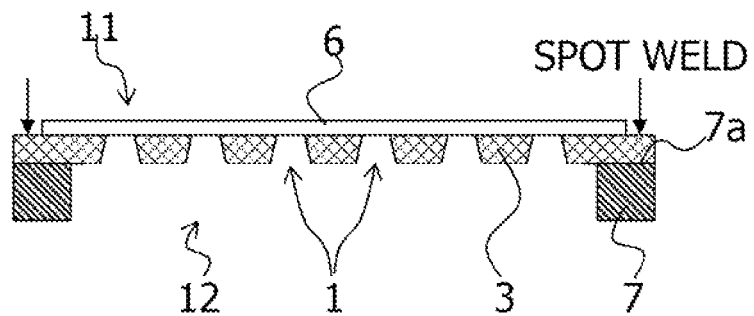

Next, as illustrated in FIG. 4B, the mask member 11 is stretched on one end face 7a of the frame 7 with tension being applied to the side parallel to the surface of the mask member 11, and then, the peripheral edge of the magnetic metal member 3 and the frame 7 are spot welded.

Notably, before the mask member 11 is bonded to the frame 7, the opening patterns 4 and the mask-side alignment marks 5 may be formed on the film 6. However, in this case, a slight extension may be caused even if tension by which the mask member 11 is not warped to the side parallel to the surface of the mask member 11 is applied as described above, since the mask member 11 is thin with a thickness of tens of micrometers. Therefore, after the mask member 11 is bonded to the frame 7, the opening patterns 4 and the mask-side alignment marks 5 might be shifted from proper positions, which may cause misalignment to the substrate. In order to solve such a problem, according to the present invention, the opening patterns 4 and the mask-side alignment marks 5 are formed after the mask member 11 is bonded to the frame 7. Hereinbelow, a process of forming the opening patterns 4 and the mask-side alignment marks 5 will be described.

The above third step S3 is a process in which the portion of the film 6 at the position corresponding to the thin-film pattern in each of the first through-holes 1 is irradiated with laser light L to form the opening pattern 4 with a shape and dimension equal to those of the thin-film pattern, and the portion of the film 6 at the position corresponding to the substrate-side alignment mark in each of the second through-holes 2 is irradiated with laser light L to form the mask-side alignment mark 5.

Figure 5A:
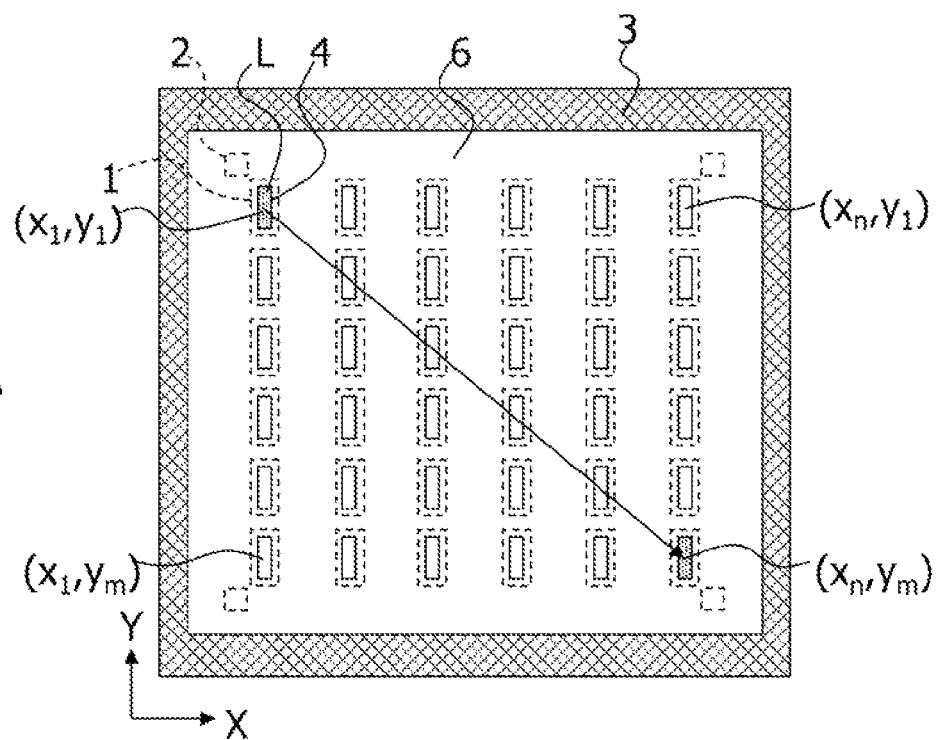
FIGS. 5A and 5B are explanatory views illustrating formation of opening patterns and mask-side alignment marks on a film.

More specifically, as illustrated in FIG. 5A, the first through-hole 1 at the upper-left corner is first irradiated with laser light L, which is shaped such that its cross-sectional shape orthogonal to an optical axis has a shape and dimension equal to those of the thin-film pattern and has an energy density of 1 J/cm$^2$ to 20 J/cm$^2$, by using excimer laser with KrF 248 nm or third harmonic or fourth harmonic of YAG laser, with a wavelength of 400 nm or less, to allow the film 6 to undergo ablation. With this process, the opening pattern 4 is formed.

Similarly, the irradiated position of the laser light L is vertically and horizontally moved from the first through-hole 1 at the upper-left corner to the first through-hole 1 at the lower-right corner in a stepwise manner as illustrated in FIG. 5A by an arrow, with the pitch the same as that of the array pitch of the thin-film patterns by moving a stage (not shown) on which the mask member 11 is placed, and with this, each of the opening pattern 4 is formed at the portion of the film 6 in the corresponding first through-hole 1. Then, the position of each of the formed opening patterns 4 is measured to obtain X-Y coordinates $(x_1, y_1)$, $(x_1, y_2)$, $(x_1, y_3)$, . . . $(x_n, y_m)$ of each opening pattern 4, and the obtained coordinates are stored in a memory.

Then, the X-Y coordinates of each of the opening patterns 4 are read from the memory, and equations $$x_c = \Sigma x_i/n$$

$$y_c = \Sigma y_j/m$$

are calculated to calculate a coordinate $(x_c, y_c)$ at the center of an opening-pattern formation region in which the plurality of opening patterns 4 is formed.

Figure 5B:
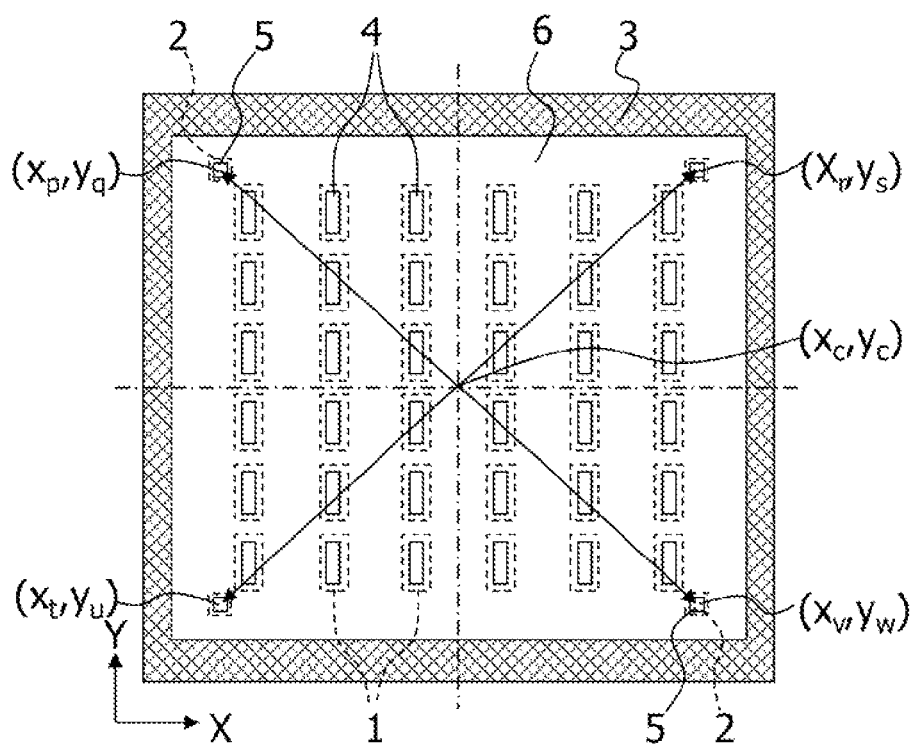

Then, as illustrated in FIG. 5B, the mask-side alignment marks 5 are processed with a laser at the positions of X-Y coordinates $(x_p, y_q)$, $(x_r, y_s)$, $(x_t, y_u)$, and $(x_v, y_w)$ in the second through-holes 2, these positions being apart from the coordinates $(x_c, y_c)$ in X and Y directions at the center of the opening-pattern formation region, serving as a reference, by predetermined distances. Thus, the deposition mask illustrated in FIGS. 2A and 2B is formed.

When the mask-side alignment marks 5 are formed with the coordinates $(x_c, y_c)$ at the center of the opening-pattern formation region being defined as a reference, accumulated errors of the opening patterns 4 based on mechanical error of the moving mechanism for the stage are averaged, whereby positional accuracy in forming the mask-side alignment marks 5 can be improved.

Figure 6:
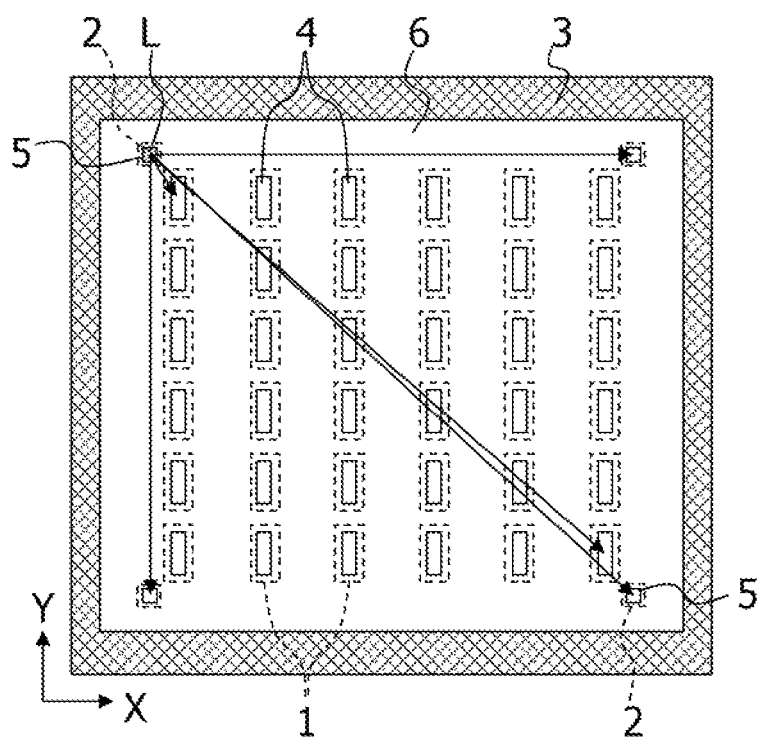
FIG. 6 is an explanatory view illustrating another formation example of opening patterns and mask-side alignment marks on a film.

FIG. 6 is a plan view illustrating another example of the above third step S3.

In this case, one mask-side alignment mark 5 is first formed in the second through-hole 2 located at the upper-left corner in FIG. 6, for example, the irradiated position of the laser light L is moved in the X-Y direction in a stepwise manner according to the design dimension based on the mask-side alignment mark 5. With this movement of the irradiated position, the portion of the film 6 in each of the first through-holes 1 is processed by laser, and the portions of the film 6 in the other second through-holes 2 are also processed by laser to form the other mask-side alignment marks 5. Even in this case, the opening patterns 4 and the mask-side alignment marks 5 are formed with the mask member 11 being stretched on the frame 7, whereby the positional accuracy in forming the opening patterns 4 and the mask-side alignment marks 5 can be improved.

In the above embodiment, the opening patterns 4 are formed by changing the irradiated position of the laser light L with the stepwise movement of the stage according to its mechanical accuracy. However, the present invention is not limited thereto. The mask member 11 may be placed onto a reference substrate on which a reference pattern serving as an irradiation target of the laser light L is formed to correspond to the formation position (design value) of the opening patterns 4, and the laser light L may be emitted at the reference pattern on the reference substrate, while moving the stage in a stepwise manner, to form the opening patterns 4.

In the above description, the first through-holes 1 are rectangular, and are disposed on the magnetic metal member 3 in a matrix at regular intervals, and each of the plurality of opening patterns 4 is formed in a corresponding first through-hole 1. However, the present invention is not limited thereto. Each of the plurality of first through-holes 1 may have a stripe shape, and may be disposed parallel to the magnetic metal member 3 at regular intervals, and each of the plurality of opening patterns 4 may have a stripe shape, and may be formed in a corresponding first through-hole 1.

It should be noted that the entire contents of Japanese Patent Application No. 2012-250972, filed on Nov. 15, 2012, on which convention priority is claimed, is incorporated herein by reference.

It should also be understood that many modifications and variations of the described embodiments of the invention will be apparent to one skilled in the art without departing from the spirit and scope of the present invention as claimed in the appended claims.

What is claimed is:

1. A production method for a deposition mask for forming a plurality of thin-film patterns on a substrate, the production method comprising:

a first step of forming a mask member in which a resin film and a magnetic metal member, which has a plurality of first and second through-holes formed at positions respectively corresponding to the plurality of thin-film patterns and a plurality of substrate-side alignment marks preliminarily formed on the substrate, are brought into close contact with each other, each of the first and second through-holes having a shape and dimension greater those that of the thin-film pattern, and each of the second through-holes having a shape and dimension greater than those of the substrate-side alignment mark;

a second step in which the mask member is stretched on one end face of a frame having an opening enclosing the plurality of first and second through-holes of the magnetic metal member, and a peripheral edge of the magnetic metal member is bonded to the end face of the frame; and a third step in which a portion of the film at the position corresponding to the thin-film pattern in each of the first through-holes is irradiated with laser light to form an opening pattern having a shape and dimension the same as those of the thin-film pattern, and a portion of the film at the position corresponding to the substrate-side alignment mark in each of the second through-holes is irradiated with laser light to form a mask-side alignment mark.

2. The production method for a deposition mask according to claim 1, wherein the third step comprises the steps of:

forming each of the opening patterns at the portion of the film in the corresponding first through-hole by moving an irradiated position of the laser light by a predetermined distance in a stepwise manner, and reading and storing a coordinate of each opening pattern in an X-Y plane;

reading the stored coordinates of the opening patterns to calculate an average value, and calculating a coordinate at a center of an opening-pattern formation region in which the plurality of opening patterns is formed; and forming each of the mask-side alignment marks at the position in the corresponding second through-hole, the position being apart from the calculated coordinates at the center, serving as a reference, by a particular distance.

3. The production method for a deposition mask according to claim 1, wherein the third step comprises the steps of:

forming the mask-side alignment mark at the portion of the film in a second through-hole selected from the plurality of second through-holes; and forming each of the opening patterns at the portion of the film in the corresponding first through-hole by moving an irradiated position of the laser light by a predetermined distance in a stepwise manner with the formed mask-side alignment mark being used as a reference, and forming the mask-side alignment marks other than the mask-side alignment mark in the selected second through-hole at the portions of the film in the second through-holes other than the selected second through-hole.

4. The production method for a deposition mask according to claim 1, wherein the plurality of first through-holes has a rectangular shape and is disposed on the magnetic metal member in a matrix at regular intervals, and each of the plurality of opening patterns is formed in the corresponding first through-hole.

5. The production method for a deposition mask according to claim 1, wherein the plurality of first through-holes has a stripe shape and is disposed on the magnetic metal member in parallel at regular intervals, and each of the plurality of opening patterns has a stripe shape and is formed in the corresponding first through-hole.

* * * * *